(12) United States Patent
Chan et al.

(10) Patent No.: US 8,653,661 B2
(45) Date of Patent: Feb. 18, 2014

(54) PACKAGE HAVING MEMS ELEMENT AND FABRICATION METHOD THEREOF

(75) Inventors: Chang-Yueh Chan, Taichung (TW); Chien-Ping Huang, Taichung (TW); Chun-Chi Ke, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/170,424

(22) Filed: Jun. 28, 2011

(65) Prior Publication Data

US 2012/0286425 A1   Nov. 15, 2012

(30) Foreign Application Priority Data

May 12, 2011 (TW) .............................. 100116620 A

(51) Int. Cl.
*H01L 21/56* (2006.01)

(52) U.S. Cl.
USPC .... 257/738; 438/124; 257/777; 257/E23.069; 257/E21.502

(58) Field of Classification Search
USPC ........................................................ 257/777
See application file for complete search history.

(56) References Cited

U.S. PATENT DOCUMENTS

| | | | |
|---|---|---|---|
| 6,303,986 B1 | 10/2001 | Shook | |
| 6,559,530 B2 * | 5/2003 | Hinzel et al. | 257/684 |
| 6,809,412 B1 * | 10/2004 | Tourino et al. | 257/678 |
| 6,846,725 B2 | 1/2005 | Nagarajan et al. | |
| 7,368,808 B2 * | 5/2008 | Heck et al. | 257/678 |
| 7,642,657 B2 * | 1/2010 | Suilleabhain et al. | 257/778 |
| 7,928,584 B2 * | 4/2011 | O Suilleabhain et al. | 257/778 |
| 8,338,208 B2 * | 12/2012 | Zuniga-Ortiz et al. | 438/51 |
| 8,344,493 B2 * | 1/2013 | West et al. | 257/686 |
| 2003/0054584 A1 * | 3/2003 | Hinzel et al. | 438/51 |
| 2004/0016995 A1 * | 1/2004 | Kuo et al. | 257/678 |
| 2006/0194361 A1 * | 8/2006 | Heck et al. | 438/48 |
| 2007/0035001 A1 * | 2/2007 | Kuhmann et al. | 257/680 |
| 2008/0157339 A1 * | 7/2008 | O Suilleabhain et al. | 257/690 |
| 2008/0303126 A1 * | 12/2008 | Wang et al. | 257/676 |
| 2008/0315390 A1 * | 12/2008 | Kuhmann et al. | 257/690 |
| 2009/0140413 A1 * | 6/2009 | Wang et al. | 257/698 |
| 2009/0267223 A1 * | 10/2009 | Wachtler et al. | 257/710 |
| 2009/0280602 A1 * | 11/2009 | Bonifield et al. | 438/118 |
| 2010/0032268 A1 * | 2/2010 | Suilleabhain et al. | 200/181 |
| 2010/0127377 A1 * | 5/2010 | Bauer et al. | 257/690 |
| 2010/0190294 A1 * | 7/2010 | Simmons-Matthews | 438/108 |
| 2010/0193945 A1 * | 8/2010 | Hochstenbach et al. | 257/737 |
| 2010/0207217 A1 * | 8/2010 | Zuniga-Ortiz et al. | 257/415 |
| 2010/0258950 A1 * | 10/2010 | Li et al. | 257/777 |
| 2011/0027941 A1 * | 2/2011 | Kumar et al. | 438/106 |
| 2011/0037170 A1 * | 2/2011 | Shinohara | 257/737 |

(Continued)

*Primary Examiner* — Julio J Maldonado
*Assistant Examiner* — Jaehwan Oh
(74) *Attorney, Agent, or Firm* — Edwards Wildman Palmer LLP; Peter F. Corless; Steven M. Jensen

(57) ABSTRACT

A package structure having an MEMS element is provided, which includes: a protection layer having openings formed therein; conductors formed in the openings, respectively; conductive pads formed on the protection layer and the conductors; a MEMS chip disposed on the conductive pads; and an encapsulant formed on the protection layer for encapsulating the MEMS chip. By disposing the MEMS chip directly on the protection layer to dispense with the need for a carrier, such as a wafer or a circuit board that would undesirably add to the thickness, the present invention reduces the overall thickness of the package to thereby achieve miniaturization.

18 Claims, 5 Drawing Sheets

(56) References Cited

U.S. PATENT DOCUMENTS

| | | | |
|---|---|---|---|
| 2011/0156178 A1* | 6/2011 | Zuniga-Ortiz et al. | 257/415 |
| 2011/0175179 A1* | 7/2011 | Chiu et al. | 257/418 |
| 2011/0177643 A1* | 7/2011 | Chiu et al. | 438/51 |
| 2011/0186839 A1* | 8/2011 | Yang et al. | 257/48 |
| 2012/0133042 A1* | 5/2012 | Hayashi et al. | 257/737 |
| 2012/0313235 A1* | 12/2012 | Chu et al. | 257/692 |

* cited by examiner

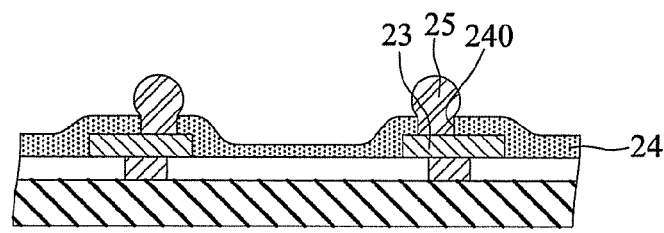
FIG.2E
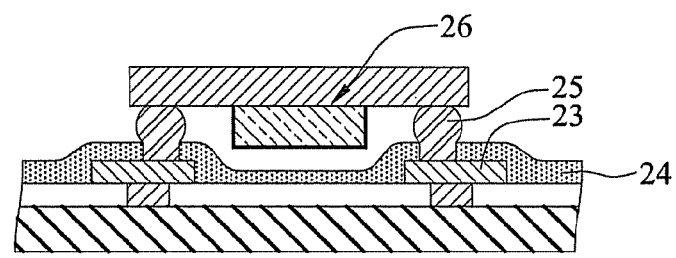
FIG.2F
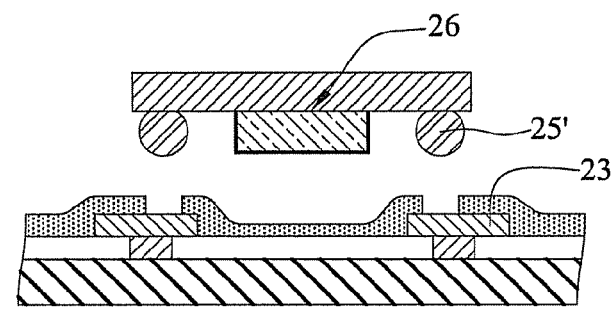
FIG.2F'
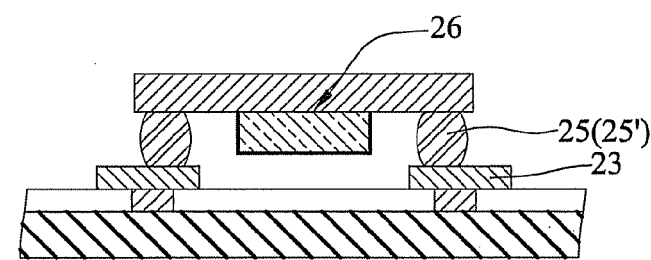
FIG.2F"

PACKAGE HAVING MEMS ELEMENT AND FABRICATION METHOD THEREOF

CROSS-REFERENCES TO RELATED APPLICATIONS

This application claims under 35 U.S.C. §119(a) the benefit of Taiwanese Application No. 100116620, filed May 12, 2011, the entire contents of which is incorporated herein by reference.

BACKGROUND OF THE INVENTION

1. Field of the Invention

The present invention relates to semiconductor packages, and, more particularly, to a semiconductor package having a MEMS (micro-electro-mechanical system) element.

2. Description of Related Art

MEMS elements have integrated electrical and mechanical functions and can be fabricated through various micro-fabrication technologies. A MEMS element can be disposed on a chip and covered by a shield or packaged with an underfill adhesive so as to form a MEMS package structure. FIGS. 1A to 1D show various types of MEMS package structures in the art.

FIG. 1A shows a MEMS package structure as disclosed by U.S. Pat. No. 6,809,412. Referring to FIG. 1A, a chip 14 having a MEMS element 141 is disposed on a substrate 10 and electrically connected to the substrate 10 through a plurality of bonding wires 11. Then, a glass lid 12 is disposed on the substrate 10 to cover the chip 14, the MEMS element 141 and the bonding wires 11.

FIG. 1B shows a MEMS package structure as disclosed by U.S. Pat. No. 6,303,986. Referring to FIG. 1B, a glass lid 12 is disposed on a chip 14 so as to cover a MEMS element 141 of the chip 14. Then, the chip 14 is disposed on a lead frame 10' and electrically connected to the lead frame 10' through bonding wires 11 Finally, an encapsulant 15 is formed to encapsulate the lead frame 10', the bonding wires 11, the glass lid 12 and the chip 14.

However, the carriers of the above-described structures (the substrate 10 of FIG. 1A and the lead frame 10' of FIG. 1B) increase the thickness of the structures, thus adversely affecting miniaturization of the package structures. Therefore, carrier-free package structures were developed.

FIG. 1C shows a MEMS package structure as disclosed by U.S. Pat. No. 7,368,808. Referring to FIG. 1C, a chip 14 having a plurality of conductive pads 140 and a MEMS element 141 is provided. A glass lid 12 having a plurality of through holes 120 is disposed on the chip 14 for covering the MEMS element 141. Each of the through holes 120 has conductive pads 122 disposed on the two ends thereof. The conductive pads 122 on the lower ends of the through holes 120 electrically connect with the conductive pads 140 of the chip 14, respectively, and the conductive pads 122 on the upper ends of the through holes 120 have solder balls 16 formed thereon so as for the chip 14 to be electrically connected to other electronic components.

FIG. 1D shows a MEMS package structure as disclosed by U.S. Pat. No. 6,846,725. Referring to FIG. 1D, a chip 14 having a plurality of conductive pads 140 and a MEMS element 141 is provided, and the conductive pads 140 have solder bumps 142 disposed thereon. A glass lid 12 having a plurality of through holes 120 is disposed on the chip 14 for covering the MEMS element 141. Each of the through holes 120 has conductive pads 122 disposed on the two ends thereof. The conductive pads 122 on the lower ends of the through holes 120 electrically connect with the solder bumps 142, respectively, and the conductive pads 122 on the upper ends of the through holes 120 are used for electrically connecting the chip 14 to other electronic components.

Although the last two above-described package structures eliminate the need of a carrier so as to achieve miniaturization, the cost for drilling through holes 120 in the lids 12 is quite high. Further, it is difficult to align the conductive pads 122 at the two ends of each of the conductive through holes 120 with a high degree of accuracy or stably secure the conductive pads 122 to the conductive through holes 120, thus easily leading to poor electrical connection and accordingly reducing the reliability of electrical connection between the chip 14 and an external electronic component.

Therefore, it is imperative to provide a package having a MEMS element so as to overcome the above-described drawbacks.

SUMMARY OF THE INVENTION

Accordingly, the present invention provides a package having a MEMS element, which comprises: a protection layer having opposite first and second surfaces and a plurality of openings in communication with the first and second surfaces; a plurality of conductors formed in the openings of the protection layer, respectively; a plurality of conductive pads formed on the first surface of the protection layer and the conductors for electrically connecting the conductors; a MEMS chip disposed on and electrically connected to the conductive pads; and an encapsulant formed on the protection layer for encapsulating the MEMS chip, wherein the conductors are exposed from the second surface of the protection layer and the encapsulant.

The present invention further provides a fabrication method of a package having a MEMS element, which comprises the steps of: providing a carrier; forming on the carrier a protection layer having opposite first and second surfaces in a manner that the protection layer is attached to the carrier via the second surface thereof and forming in the protection layer a plurality of openings in communication with the first and second surfaces for exposing portions of the carrier; forming a plurality of conductors in the openings of the protection layer, respectively; forming a plurality of conductive pads on the first surface of the protection layer and the conductors such that the conductive pads electrically connect the conductors, respectively; disposing a MEMS chip on the conductive pads so as to electrically connect the MEMS chip and the conductive pads; forming an encapsulant on the first surface of the protection layer for encapsulating the MEMS chip; and removing the carrier to expose the conductors from the second surface of the protection layer.

In the above-described package and the fabrication method thereof, a plurality of solder balls can be disposed on exposed surfaces of the conductors, respectively.

In the above-described package and the fabrication method thereof, a solder mask layer can be formed on the first surface of the protection layer and have a plurality of openings for exposing the conductive pads, respectively.

Further, a plurality of conductive bumps can be disposed on the conductive pads or on the MEMS chip for electrically connecting the conductive pads and the MEMS chip.

Through the step of removing the carrier, the present invention obtains a carrier-free package. Compared with the conventional art that requires a substrate or lead frame that increases the package thickness, the present invention reduces the overall thickness of the package so as to achieve miniaturization. Further, by forming the conductors in the protection layer, the present invention avoids a conventional drilling process so as to simplify the fabrication process and reduce the fabrication cost.

Furthermore, since the package can be fabricated through wafer-level packaging without the need of a conventional substrate or lead frame, a lot of fabrication steps can be avoided so as to save fabrication time and reduce costs.

BRIEF DESCRIPTION OF DRAWINGS

FIGS. 2A to 2I are cross-sectional views showing a fabrication method of a package having a MEMS element according to the present invention, wherein FIG. 2D' shows another embodiment of FIG. 2D, FIG. 2F' shows another embodiment of FIG. 2E, FIG. 2F" shows another embodiment of FIGS. 2F and 2F', and FIG. 2H' shows another embodiment of FIG. 2H.

DETAILED DESCRIPTION OF PREFERRED EMBODIMENTS

The following illustrative embodiments are provided to illustrate the disclosure of the present invention and its advantages, these and other advantages and effects being apparent to those in the art after reading this specification.

It should be noted that the drawings are only for illustrative purposes and not intended to limit the present invention. Meanwhile, indicators such as 'up', 'down', 'a' and so on are only used as a matter of descriptive convenience and not intended to have any other significance or provide limitations for the present invention.

FIGS. 2A to 2I show a fabrication method of a package having a MEMS element according to the present invention.

Figure 1A:
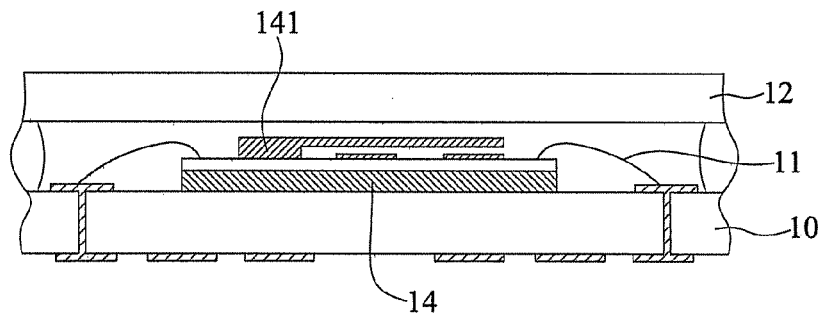
FIGS. 1A to 1D are cross-sectional views showing various types of MEMS package structures in the prior art.
Figure 1B:
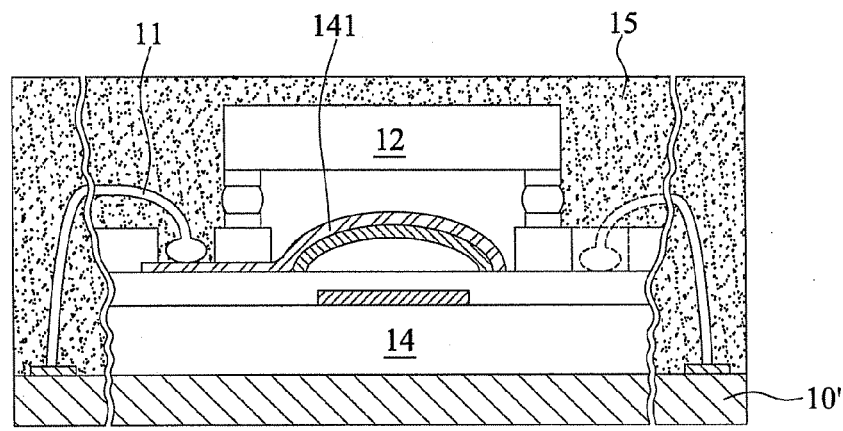
Figure 1C:
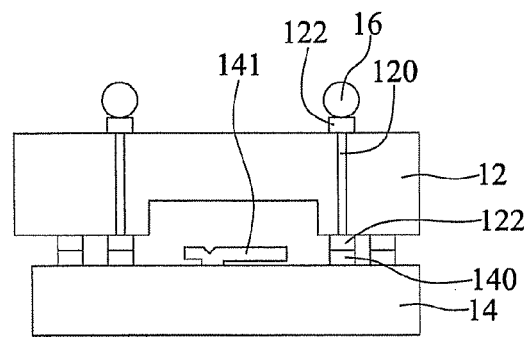
Figure 1D:
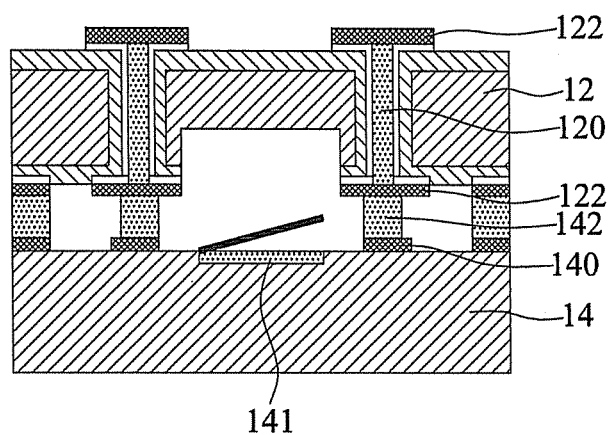
Figure 2A:
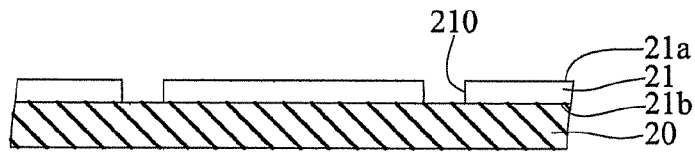

Referring to FIG. 2A, a carrier 20 is provided. A protection layer 21 having a first surface 21a and a second surface 21b, is formed on the carrier 20 with the second surface 21b attached to the carrier 20. In the present embodiment, the carrier 20 is a metal plate, and the protection layer 21 is made of a non-conductive material such as a dielectric material, a semiconductor material, a solder resist material, or an insulating material.

Subsequently, a patterning process is performed including various steps, such as coating a resist layer, exposing and developing the resist layer so as to form a plurality of openings 210 in the protection layer 21 for exposing portions of the carrier 20. The openings 210 are in communication with the first surface 21a and the second surface 21b.

Figure 2B:
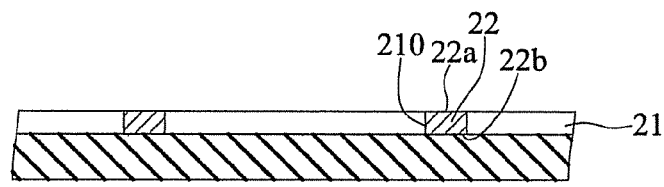

Referring to FIG. 2B, a plurality of conductors 22 is formed in the openings 210 of the protection layer 21 through electroplating or electroless plating. Each of the conductors 22 has an upper surface 22a and a lower surface 22b. In the present embodiment, the conductors 22 are made of copper.

Figure 2C:
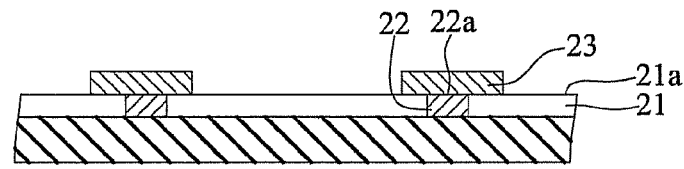

Referring to FIG. 2C, a plurality of conductive pads 23 are formed on the first surface 21a of the protection layer 21 and the upper surfaces 22a of the conductors 22 through electroplating or electroless plating and patterning such that the conductive pads 23 electrically connect with the conductors 22, respectively.

Figure 2D:
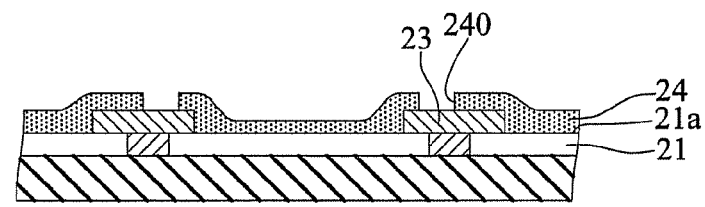
Figure 2D:
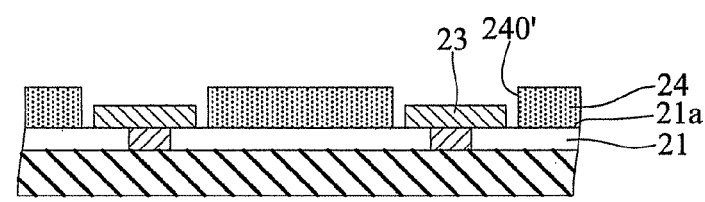

Referring to FIG. 2D, a solder mask layer 24 is formed on the first surface 21a of the protection layer 21 and the conductive pads 23, and a plurality of openings 240 are formed in the solder mask layer 24 corresponding in position to the conductive pads 23. In the present embodiment, each of the openings 240 is solder mask defined so as to partially expose the corresponding conductive pad 23.

In another embodiment, referring to FIG. 2D', each of the openings 240' is non-solder mask defined so as to expose the entire upper surface of the corresponding conductive pad 23 and a portion of the first surface 21a of the protection layer 21 around the periphery of the conductive pad 23.

Referring to FIG. 2E, a plurality of conductive bumps 25 are formed on the conductive pads 23 in the openings 240 of the solder mask layer 24, respectively. In the present embodiment, the conductive bumps 25 are made of gold or a solder material.

Referring to FIG. 2F, at least a MEMS chip 26 is disposed on the conductive bumps 25 so as to be electrically connected to the conductive pads 23 through the conductive bumps 25. The MEMS chip 26 can be, for example, a gyroscope, an accelerometer or an RF element.

Referring to FIG. 2F', in another embodiment, a plurality of conductive bumps 25' are formed on the MEMS chip 26 such that the MEMS chip 26 can be disposed on the conductive pads 23 through the conductive bumps 25'.

Alternatively, referring to FIG. 2F", the step of forming a solder mask layer as in FIG. 2D is omitted and the MEMS chip 26 is disposed on the conductive pads 23 through the conductive bumps 25 or 25'.

Figure 2G:
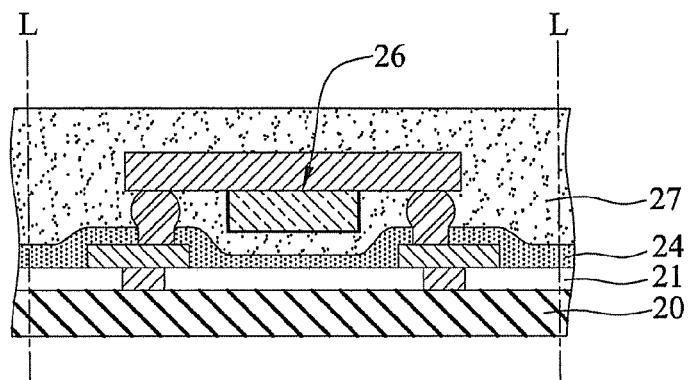

Referring to FIG. 2G an encapsulant 27 is formed on the solder mask layer 24 for encapsulating the MEMS chip 26.

Figure 2H:
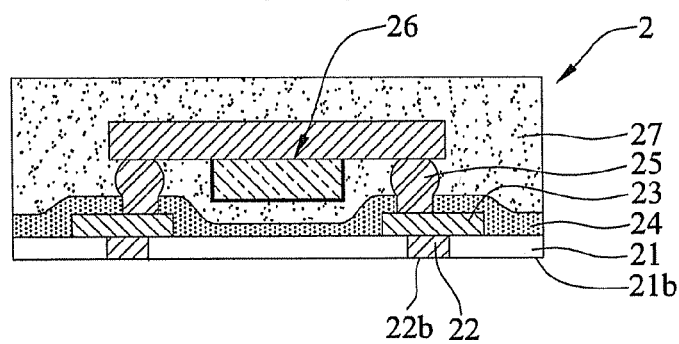
Figure 2H:
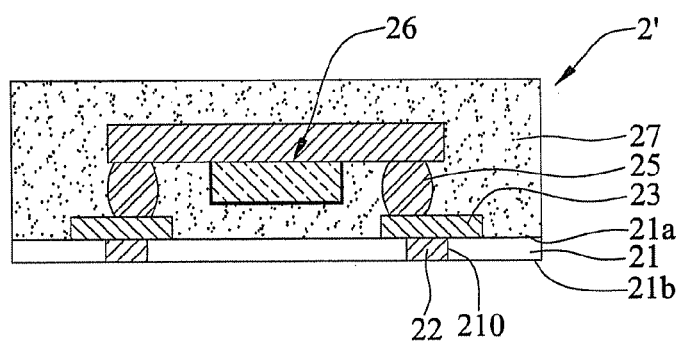

Referring to FIG. 2H, the carrier 20 is removed such that the lower surfaces 22b of the conductors 22 are exposed from the second surface 21b of the protection layer 21. Then, a singulation process is performed along a cutting line L as shown in FIG. 2G to obtain a package 2.

Referring to FIG. 2H', continuing from FIG. 2F", a package 2' without the solder mask layer 24 is obtained.

The present invention further provides a package 2' having a MEMS element, which has a protection layer 21 having a first surface 21a and a second surface 21b and a plurality of openings 210 in communication with the first surface 21a and the second surface 21b; a plurality of conductors 22 formed in the openings 210, respectively; a plurality of conductive pads 23 formed on the first surface 21a of the protection layer 21 and the conductors 22 for electrically connecting with the conductors 22; a MEMS chip 26 disposed on and electrically connected to the conductive pads 23; and an encapsulant 27 formed on the protection layer 21 for encapsulating the MEMS chip 26, wherein the conductors 22 are exposed from the second surface 21b of the protection layer 21 and the encapsulant 27.

In another embodiment, the package 2 further has a solder mask layer 24 formed on the first surface 21a of the protection layer 21 and the solder mask layer 24 is formed with a plurality of openings 240' for completely exposing the conductive pads 23 so as for the MEMS chip 26 to be disposed thereon. Alternatively, the openings of the solder mask layer 24 can be formed to partially expose the corresponding conductive pads 23, respectively. Further, the encapsulant 27 is formed on the solder mask layer 24 such that the solder mask layer 24 is positioned between the encapsulant 27 and the protection layer 21.

In the packages 2, 2', a plurality of conductive bumps 25 are disposed between the conductive pads 23 and the MEMS chip 26 for connecting the conductive pads 23 and the MEMS chip 26.

Figure 2I:
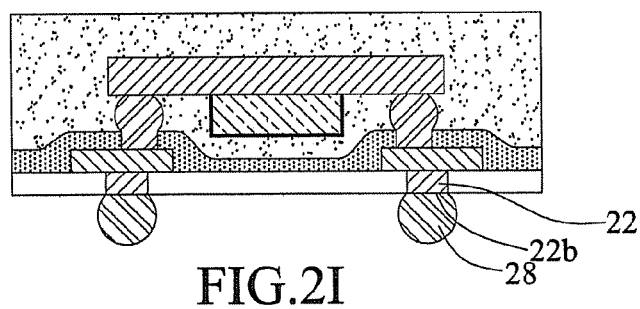

Furthermore, as shown in FIG. 2I, a plurality of solder balls 28 can be disposed on the lower surfaces 22b of the conductors 22, respectively, according to the practical need.

Therefore, the present invention removes the carrier 20 to reduce the overall thickness of the packages 2, 2' so as to achieve miniaturization.

Further, by encapsulating the MEMS chip 26 with the encapsulant 27 and forming the conductors 22 in the protection layer 21, the present invention avoids a conventional drilling process, thereby reducing the fabrication cost.

The above-described descriptions of the detailed embodiments are intended to illustrate the preferred implementations according to the present invention but are not intended to limit the scope of the present invention. Accordingly, numerous modifications and variations completed by those with ordinary skill in the art will within the scope of present invention as defined by the appended claims.

What is claimed is:

1. A package having a Micro-Electro-Mechanical System (MEMS) element, comprising:
    a protection layer having opposite first and second surfaces and a plurality of openings in communication with the first and second surfaces;
    a plurality of conductors formed in the openings of the protection layer, respectively, wherein each of the conductors has opposite third and fourth surfaces, and the fourth surface of each of the conductors is flush with the second surface of the protection layer;
    a plurality of conductive pads formed on the first surface of the protection layer and the third surface of each of the conductors, for electrically connecting with the conductors, wherein the conductive pads are free from being formed on the fourth surface of each of the conductors;
    a plurality of conductive bumps disposed on the conductive pads and electrically connected to the conductive pads;
    a MEMS chip disposed on the conductive bumps and electrically connected to the conductive pads by the conductive bumps; and
    an encapsulant formed on the protection layer for encapsulating the MEMS chip, wherein the fourth surface of each of the conductors is exposed from the second surface of the protection layer and the encapsulant.

2. The package of claim 1, wherein the protection layer is made of a non-conductive material.

3. The package of claim 1, wherein the conductors are made of copper.

4. The package of claim 1, further comprising a plurality of solder balls disposed on the fourth surface of each of the conductors, respectively.

5. The package of claim 1, further comprising a solder mask layer formed on the first surface of the protection layer and having a plurality of openings through which the conductive pads are exposed so as for the MEMS chip to be disposed thereon.

6. The package of claim 5, wherein the encapsulant is formed on the solder mask layer.

7. The package of claim 1, wherein the conductive bumps are made of gold or a solder material.

8. A fabrication method of a package having a MEMS element, comprising the steps of:
    forming on a carrier a protection layer having opposite first and second surfaces in a manner that the protection layer is attached to the carrier via the second surface thereof, and forming in the protection layer a plurality of openings in communication with the first and second surfaces for exposing portions of the carrier;
    forming a plurality of conductors in the openings of the protection layer, respectively, wherein each of the conductors has opposite third and fourth surfaces, and the fourth surface of each of the conductors is in contact with the carrier;
    forming a plurality of conductive pads on the first surface of the protection layer and the third surface of each of the conductors, respectively, so as for the conductors to be electrically connected to the conductive pads;
    disposing a MEMS chip on the conductive pads and electrically connecting the MEMS chip to the conductive pads;
    forming an encapsulant on the first surface of the protection layer for encapsulating the MEMS chip; and
    removing the carrier to expose the fourth surface of each of the conductors from the second surface of the protection layer.

9. The method of claim 8, wherein the carrier is a metal plate.

10. The method of claim 8, wherein the protection layer is made of a non-conductive material.

11. The method of claim 8, wherein the conductors are made of copper.

12. The method of claim 8, further comprising disposing a plurality of solder balls on exposed surfaces of the conductors, respectively.

13. The method of claim 8, before disposing the MEMS chip, further comprising forming a solder mask layer on the first surface of the protection layer and forming a plurality of openings in the solder mask layer for exposing the conductive pads, respectively.

14. The method of claim 13, wherein the encapsulant is formed on the solder mask layer such that the solder mask layer is positioned between the encapsulant and the protection layer.

15. The method of claim 8, further comprising forming conductive bumps on the conductive pads for electrically connecting the MEMS chip to the conductive pads.

16. The method of claim 15, wherein the conductive bumps are made of gold or a solder material.

17. The method of claim 8, wherein the MEMS chip has conductive bumps disposed thereon so as for the MEMS chip to be disposed on the conductive pads via the conductive bumps.

18. The method of claim 17, wherein the conductive bumps are made of gold or a solder material.

\* \* \* \* \*